United States Patent
Shariff et al.

(10) Patent No.: US 11,670,549 B2
(45) Date of Patent: Jun. 6, 2023

(54) SEMICONDUCTOR PACKAGES WITHOUT DEBRIS

(71) Applicant: UTAC Headquarters Pte. Ltd., Singapore (SG)

(72) Inventors: Dzafir Bin Mohd Shariff, Singapore (SG); Enrique Jr Sarile, Singapore (SG); Seung Geun Park, Singapore (SG)

(73) Assignee: UTAC Headquarters Pte Ltd, Singapore (SG)

( * ) Notice: Subject to any disclaimer, the term of this patent is extended or adjusted under 35 U.S.C. 154(b) by 165 days.

(21) Appl. No.: 17/125,917

(22) Filed: Dec. 17, 2020

(65) Prior Publication Data

US 2021/0193522 A1    Jun. 24, 2021

Related U.S. Application Data

(60) Provisional application No. 62/949,459, filed on Dec. 18, 2019.

(51) Int. Cl.
*H01L 21/78* (2006.01)
*H01L 23/544* (2006.01)
*H01L 21/768* (2006.01)

(52) U.S. Cl.
CPC ........ *H01L 21/78* (2013.01); *H01L 21/76838* (2013.01); *H01L 23/544* (2013.01)

(58) Field of Classification Search
CPC . H01L 21/78; H01L 21/76838; H01L 23/544; H01L 2221/68327; H01L 21/6835
USPC .......................................................... 257/620
See application file for complete search history.

(56) References Cited

U.S. PATENT DOCUMENTS 10,784,161 B2 *   9/2020   Muri ................... H01L 23/3114
10,896,819 B2 *   1/2021   Noma ............... H01L 21/32134

* cited by examiner

*Primary Examiner* — Vu A Vu
(74) *Attorney, Agent, or Firm* — Horizon IP Pte Ltd.

(57) ABSTRACT

A semiconductor package which is free of metal debris from backside metallization (BSM) is disclosed. The semiconductor package is singulated by performing a saw street open process from the frontside of the wafer and then includes a singulation process using a plasma etch from the backside of the wafer with BSM. The singulation process results in metal debris free packages.

20 Claims, 8 Drawing Sheets

SEMICONDUCTOR PACKAGES WITHOUT DEBRIS

CROSS-REFERENCE TO RELATED APPLICATION

This application claims the benefit of U.S. Provisional Application Ser. No. 62/949,459, filed on Dec. 18, 2019, which is herein incorporated by reference in its entirety for all purposes.

FIELD OF THE INVENTION

The present invention generally relates to a semiconductor package. More specifically, the present invention is directed to a semiconductor package being free of metal debris.

BACKGROUND

The recent rapid dissemination of smartphones and other mobile and wearable electronic terminals reflects the demand for faster and smaller products. The growing demand for faster and smaller products concomitantly requires semiconductor packages to have smaller footprints. With Wafer Level Chip Scale Package (WLCSP), semiconductor packages have the smallest possible package footprint and superior electrical and thermal performance. WLCSP refers to the technology of packaging an integrated circuit (IC) at the wafer level, instead of the traditional process of assembling individual units in packages after dicing them from a wafer. After the wafer level packaging of ICs is completed, a singulation process is conducted to separate the wafer to individual semiconductor packages.

A wafer may include backside metallization (BSM). For example, a metal stack may be formed on the backside of the wafer. BSM is employed to meet power, speed, reliability as well as improved circuit performance. BSM enables the semiconductor package to be optimized for electrical, mechanical, and thermal requirements. For example, the wafer with dies may be thinned to improve circuit performance. The BSM improves the mechanical strength of the thinned wafer and thermal dissipation.

However, one problem with conventional singulation process of a wafer with BSM is that metal debris from the BSM remains on the packages. The debris can cause failures such as poor reliability due to short circuiting when the package is being used.

From the foregoing discussion, there is a desire to provide a package free of debris for a reliable and functional product.

SUMMARY

Embodiments of the present disclosure generally relate to semiconductor packages.

An embodiment related to a method of forming a device is disclosed. The method includes providing a wafer with a front surface and a back surface, the front surface including a plurality of dies, wherein the wafer includes defined saw streets in first and second orthogonal directions between rows and columns of dies. Saw street openings are formed on the front surface of the wafer on the saw streets. Backside metallization (BSM) is formed over the back surface of the wafer. The method further includes etching the wafer from the back surface of the wafer to completely singulate the dies, wherein singulating the wafer into dies avoids metal debris on sides of the dies.

Another embodiment related to a semiconductor package is disclosed. The semiconductor package includes a substrate with a first surface, a second surface and sidewalls. The package also includes backside metallization (BSM) over the second surface of the substrate. A sidewall profile of the semiconductor package includes an etched surface with a first edge and a second edge. The first edge of the etched surface is located within the second surface of the substrate.

In yet another embodiment, a semiconductor package disclosed herein includes a die with a front die surface, a back die surface, and side die surfaces, wherein an upper portion of the die includes a second passivation layer over a first passivation layer, a top surface of the second passivation layer serves as the front die surface and a top package surface. The package also includes backside metallization (BSM) on the back die surface, wherein a bottom BSM surface which opposes a top BSM surface on the back die surface serves as the bottom package surface. A package side profile of the semiconductor package comprises an upper side package profile portion defined by vertical sidewalls of the second passivation layer, an intermediate side package profile portion defined by the first passivation layer and die portion of the die below the first passivation layer, wherein the intermediate side package profile portion is slanted and includes plasma etched intermediate side package profile surfaces, the upper side package profile portion is recessed from the intermediate side package profile portion, and a lower side package profile portion defined by vertical sidewalls of the BSM, wherein the lower side package profile portion is aligned with the back die surface.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments relate to semiconductor packages and methods for forming semiconductor packages. More particularly, embodiments relate to singulated semiconductor packages and methods for singulating semiconductor packages. In one embodiment, the semiconductor package includes a WLP, such as a WLCSP. A WLCSP may be formed by packaging semiconductor chips at wafer level followed by separation of individual chip packages from the wafer.

The semiconductor package, for example, may include one or more semiconductor dies or chips such as integrated circuits (ICs). The die in the WLCSP may include interconnects containing layers of metal traces and dielectric materials on one major surface of the die, such as the top or active surface. The die in the WLCSP may be electrically connected to an external circuit, such as a printed circuit board (PCB), by a plurality of solder balls extending between the interconnects and the external circuit.

In one embodiment, the WLCSP includes a BSM on a back or inactive surface of the wafer. The backside metallization may include a single layer of metal or a BSM stack having a plurality of metal layers. The backside metallization, for example, may include various types of metal layers, such as gold, silver, nickel, chromium, titanium, tungsten, vanadium, other metals and alloys thereof. The backside metallization, for example, may serve to improve mechanical strength and heat dissipation. Other types of packages may also be useful. Such packages may be incorporated into electronic products or equipment, including vehicles.

Figure 1:
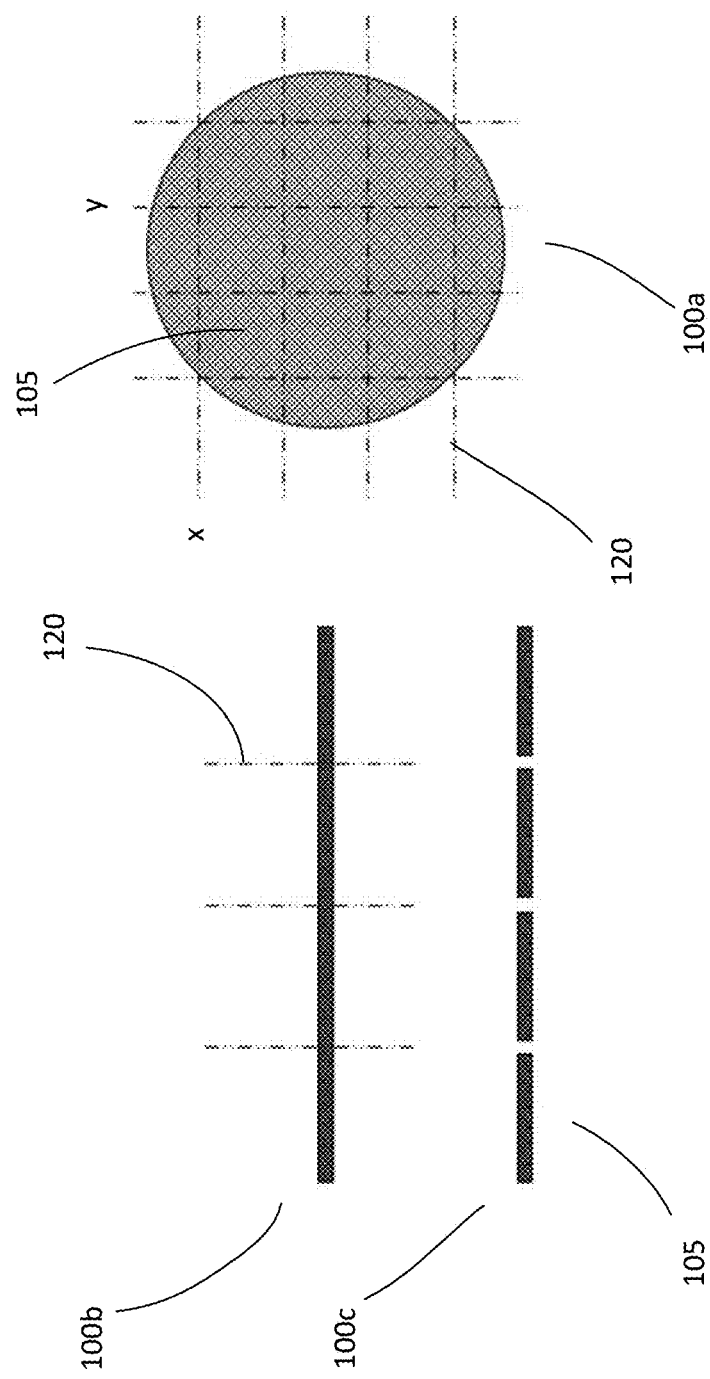
FIG. 1 shows various views of a semiconductor wafer.

Referring to FIG. 1, simplified views of a semiconductor wafer 100 are illustrated. For example, a top view 100a and side views 100b-c of the wafer are shown. The wafer may be a lightly doped p-type silicon wafer. Other types of wafers may also be employed. A plurality of devices are formed on an active surface of the wafer. For example, the active surface may be the top surface of the wafer while the inactive surface may be the bottom surface. The devices are arranged in rows along a first (x) direction and columns along a second (y) direction. After processing of the wafer is completed, for example, after formation of interconnects and BSM, the wafer is diced along dicing streets 120 in the x and y directions to singulate the devices into individual dies 105, as illustrated by the side view 100c. In one embodiment, the wafer dicing streets are defined on the frontside of the wafer and final dicing or singulation is performed from the backside of the wafer. The singulation of the wafer into individual packages or dies is achieved without metal debris deposited on sidewalls of the dies, improving reliability and yield.

Figure 2:
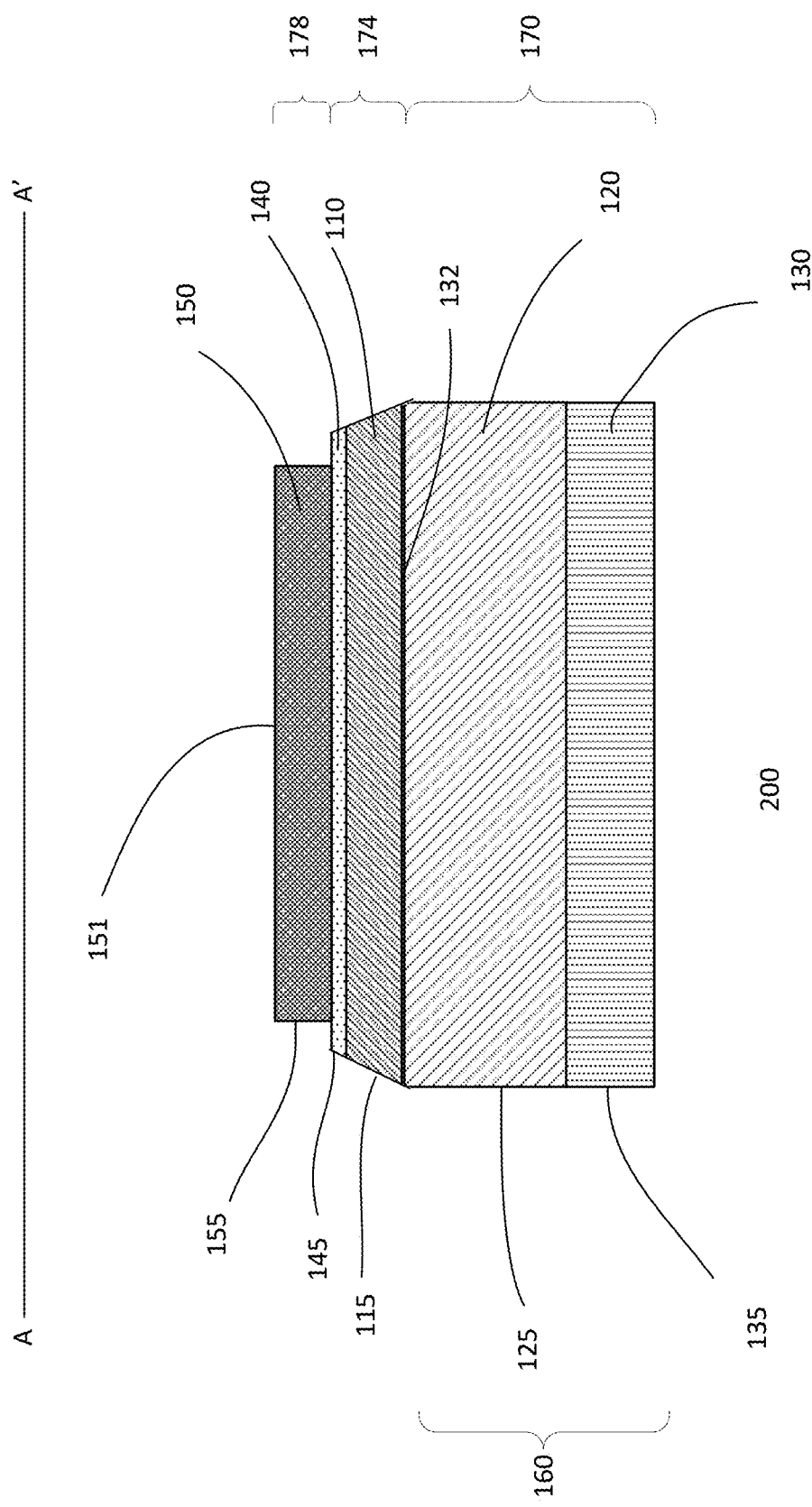
FIG. 2 shows a simplified cross-sectional view of an embodiment of a singulated chip package.

FIG. 2 shows a simplified cross-sectional view of an embodiment of a singulated semiconductor package 200 along A-A'. The semiconductor package, for example, may be a rectangular-shaped package, with the same or similar sidewall profiles on all sides. The semiconductor package may include a semiconductor die 110. The semiconductor die may include a substrate, such as a silicon substrate. The substrate includes opposing top and bottom sides. Circuit components are formed on the top side of the substrate. The top side or frontside may be referred to as the active side or active surface of the substrate. The opposing bottom side or backside may be referred to as the inactive side or inactive surface of the substrate.

A back-end-of-line (BEOL) dielectric with interconnects is formed over the active surface of the substrate. For example, the BEOL may cover the active components. The BEOL includes multiple metal or interconnect levels of metal lines and via contacts separated by dielectric material or layers for interconnecting the circuit components. The top interconnect level may serve as the pad level with contact pads for providing external connections.

A passivation stack may be provided over the BEOL dielectric. The passivation stack, for example, may include a combination of dielectric layers, such as silicon oxide and silicon nitride layers. Other types of dielectric layers may also be useful. As shown, the dielectric stack includes first and second passivation layers 140 and 150. The first passivation layer may be the bottom passivation layer on the BEOL and the second passivation layer may be the top passivation layer. The first passivation layer 140 may be about 2 μm thick. The second passivation layer 150 may be about 5 μm thick. Providing a passivation stack with other numbers of passivation layers or thicknesses may also be useful. Pad openings are formed in the passivation stack to expose die contact pads on the top interconnect level for external die connections. The passivation stack, for example, may serve as a protective stack, protecting the die from moisture and corrosion.

In one embodiment, the bottom or inactive surface of the die 110 includes a BSM 160. The BSM may include a single layer of metal or a metal stack having a plurality of metal layers. The BSM may include, for example, gold, silver, chromium, titanium, tungsten, vanadium, nickel, other metals and alloys thereof. The BSM may be formed by chemical vapor deposition, sputter deposition, e-beam evaporation or plating. Other techniques may also be useful.

As shown, the BSM includes first and second metal layers 120 and 130. The first metal layer 120 is disposed on the inactive surface of the wafer and the second metal layer 130 is disposed on the first metal layer 120. The first metal layer is a silver layer, while the second metal layer is a nickel layer. The first metal layer may be about 50 μm while the second metal layer may be about 30 μm thick. Other numbers, types, thicknesses or configurations of metal layers of the BSM may also be useful.

The top surface of the passivation stack may be referred to as the top or active package surface 151 and the bottom surface of the BSM may be referred to as the bottom or inactive package surface. In one embodiment, the dicing streets are defined using laser etching from the frontside of the wafer. Laser etching, for example, employs a protective coating. As for the final singulation, it is performed using plasma etching from the backside of the wafer. For example, a dry etch may be employed. Other types or configurations of the singulation process may also be useful.

A sidewall profile of an embodiment of a packaged die 200 is shown. The sidewall profile may include vertical and slanted portions. As shown, the sidewall profiles of the four sides of the die package are the same or about the same. Slight variations or differences may occur due to process variations.

As shown, a sidewall profile of a side of the package includes a top portion 178 with a vertical or substantially vertical sidewall, an intermediate portion 174 with a slanted sidewall, and a bottom portion 170 with a vertical or substantially vertical sidewall. As shown, the top portion is recessed from the intermediate portion and the intermediate portion slants inwardly from the bottom portion or outwardly from the top portion.

In one embodiment, the top portion 178 of the sidewall profile is created with an open process. The open process, in one embodiment, is performed on the second or top passivation layer 150. The open process, for example, may be a reactive-ion etching (RIE) using a photoresist mask. The RIE patterns the top passivation layer to form openings along the x and y dicing streets of the wafer. The RIE forms trenches at the dicing street in the second passivation layer. The RIE stops at the first or bottom passivation layer 140. For example, the first passivation layer may serve as an etch stop for the RIE. The RIE forms trenches with vertical or substantially vertical sidewalls 155 in the top passivation layer. In the case of multiple top passivation layers, the RIE may etch the top passivation layers, forming a vertical or substantially vertical sidewall profile. The vertical or substantially vertical sidewalls of the second passivation layers serve as the top portion of the sidewall profiles.

The bottom portion 170 of the sidewall profile is generated by the formation of BSM 160. For example, the BSM is formed by a plating process, such as electroplating. The plating process is performed selectively on a seed layer (not shown) over the inactive die surface 132. The seed layer may be deposited by sputtering or evaporating. Other techniques may also be useful. The seed layer may be patterned or selectively exposed in regions with the BSM to be formed. For example, an etch using a mask may be performed to remove the seed layer from the saw street region or having the saw street region covered by a plating mask, such as a resist layer. The BSM is formed on exposed portions of the seed layer.

In one embodiment, the plating process forms the first and second metal layers 120 and 130 on the seed layer over the inactive die surface 132. The plating process forms the first and second metal layers with vertical or substantially vertical sidewalls 125 and 135. The first metal layer sidewall 125 and the second metal layer sidewall 135 serve as the bottom portion 170 of the sidewall profile. Due to selective deposition of the BSM, the sidewalls of the BSM are unetched surfaces.

As for the intermediate portion 174, it is created by a cutting or dicing process. In one embodiment, the dicing process cuts the wafer and the first passivation layer 140 to singulate the die packages. The dicing process is performed from the wafer backside. In one embodiment, the dicing process is performed using a dry etch, such as a Bosch Process. The dry etch employs the selectively formed BSM as an etch mask. The dry etch creates a slanted profile in the die and first passivation layer sidewalls, for example, due to an overetch to ensure complete separation.

In one embodiment, a grooving process is performed after the open process. The grooving process, for example, may be a laser grooving process, such as laser etching. After the open process, a laser etching protective layer is formed over the wafer. In one embodiment, the laser etches the protective layer, first passivation layer 140 and an interface portion of the wafer with the BEOL dielectric. The wafer with the BEOL dielectric may be collectively referred to as the wafer.

The grooving process forms grooves along the x and y dicing streets within the trenches of the second passivation layer. The grooves, in one embodiment, include vertical or substantially vertical sidewalls. The grooves are narrower than the trench openings of the second passivation layer. This results in the sidewalls of the second passivation layer being recessed from the sidewalls of the first passivation layer and wafer. The laser etching protective layer is removed after the grooving process.

After the grooving process, the wafer is thinned, for example, by backside grinding. Other techniques for thinning the wafer is also useful. The BSM is then selectively formed on the backside of the thinned wafer. After forming the BSM, the wafer is diced by, for example, a dry etch. This results in slanted sidewalls in the intermediate portion of the die, as described.

FIGS. 3a-3f show cross-sectional views along A-A' of an embodiment of a process for forming a semiconductor package with a BSM 160. As shown is a portion of a wafer with a dicing street between portions of two packages along A-A'. It is understood that the wafer includes numerous packages separated by dicing streets in the x and y directions. The singulated semiconductor packages, for example, may be similar to the one illustrated in FIG. 2. For example, the semiconductor packages may be rectangular-shaped packages, with the same or similar sidewall profiles on all sides. Common elements may not be described or described in detail.

Figure 3A:
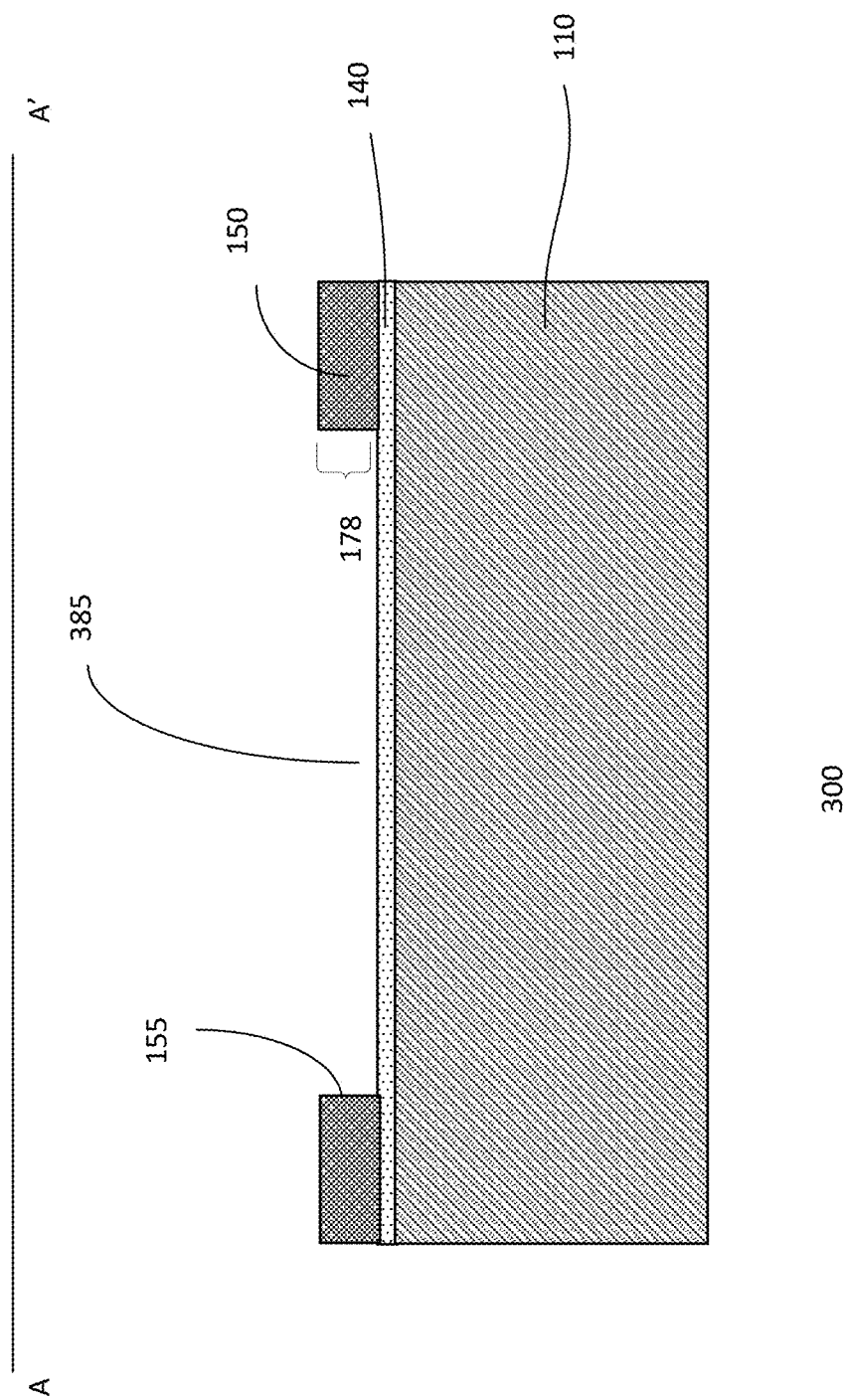
FIGS. 3a-f show simplified cross-sectional views of an embodiment of a process for forming the semiconductor package of FIG. 2.

Referring to FIG. 3a, the process 300 begins by providing a prepared wafer 110. The prepared wafer includes a plurality of processed dies with circuit components on the top or active side of the wafer. A back-end-of-line (BEOL) dielectric with interconnects covers the active components.

A passivation stack may be provided over the BEOL dielectrics. The passivation stack, for example, may include a combination of dielectric layers, such as silicon oxide and silicon nitride layers. Other types of dielectric layers may also be useful. As shown, the dielectric stack may include first and second passivation layers 140 and 150. The first passivation layer 140 may be the bottom passivation layer on the BEOL and the second passivation layer 150 may be the top passivation layer. The first passivation layer 140 may be about 2 µm thick. The second passivation layer 150 may be about 5 µm thick. Providing a passivation stack with other numbers of passivation layers may also be useful. The first passivation layer 140 may include a SiN layer, and the second passivation layer 150 may include a $SiO_2$ layer. Other types of material or configurations for the passivation stack may also be useful. Pad openings (not shown) are formed in the passivation stack to expose die contact pads on the top interconnect level for external die connections. The passivation stack, for example, may serve as a protective stack, protecting the die from moisture.

In one embodiment, an open process is employed. In one embodiment, the open process patterns the second or top passivation layer 150. The open process forms openings or trenches 385 in the top passivation layer along the dicing streets of the wafer. The open process, for example, may be a chemical etch, such as RIE using a patterned resist mask as an etch mask (not shown). Portions of the top passivation layer exposed by the etch mask are removed. The etch selectively, removes the top passivation layer and stops at the first or bottom passivation layer 140. For example, the first passivation layer may serve as an etch stop for the open process. The RIE is an anisotropic etch, forming a patterned top passivation layer with vertical or substantially vertical sidewalls 155. It is understood that process variations may cause slight variances from vertical. The vertical sidewalls or substantially vertical of the top passivation layer serve as the top passivation portion 178 of the sidewall profiles of the singulated packages.

Figure 3B:
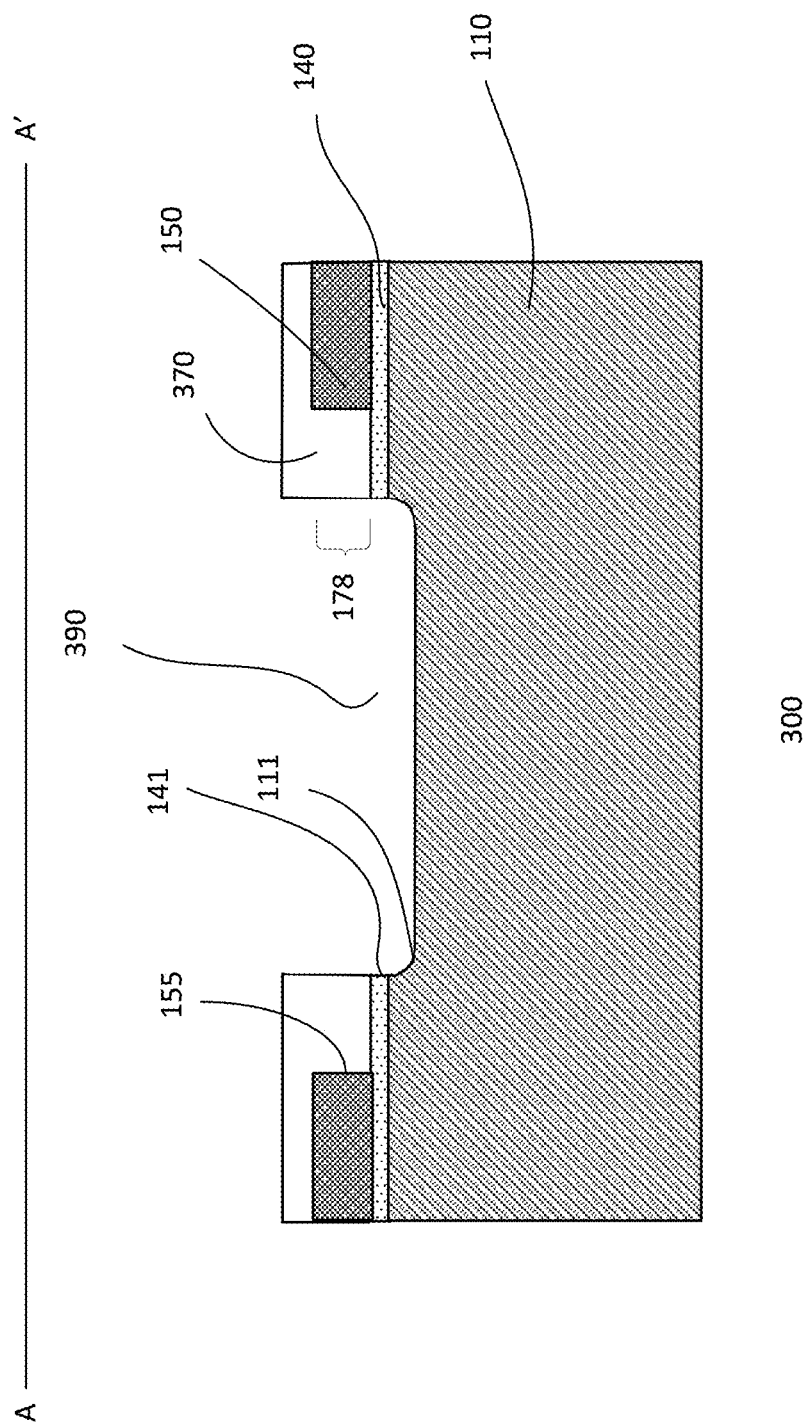

As shown in FIG. 3b, the singulation process continues with a grooving process. In one embodiment, a protective layer 370 is deposited on the wafer surface. The protective layer covers the passivation layer and fills the openings therein. The passivation layer, for example, may be a self-planarizing layer. This results in a planar surface over the wafer surface. The protective layer 370 may be a water-soluble coating material easily removed by deionized water. For example, the protective layer may include a hydrocarbon based polymer. Other types of protective layers may also be useful. The protective layer 370 may be formed by techniques such as spin on or spraying.

The grooving process, for example, may be a laser grooving process, such as laser etching. In one embodiment, the laser etches through the protective layer 370, the first passivation layer 140 and an interface or upper portion of the wafer 110 with the first passivation layer to form grooves or trenches 390 in the dicing lines of the wafer. In other words, the grooving process overetches the first passivation layer to ensure it is completely removed. The grooving process results in the sidewall of the protective layer 370, sidewall 141 of the first passivation layer 140 and sidewall 111 of the upper portion of the wafer 110 being vertical or substantially vertical. In addition, a width of the groove 390 is less than the width of the trenches 385 of the second passivation layer 150 from the open process. This results in the top passivation layer being recessed from the sidewalls of the second passivation layer and the wafer.

After the grooving process, the protective layer 370 is removed, for example, by a clean process using deionized water. Other removal processes may also be useful. After the clean process, the semiconductor wafer 110 with the passivation layers is reversed and attached to a temporary carrier 165 with the second or top passivation layer abut against the top surface of the support carrier.

Figure 3C:
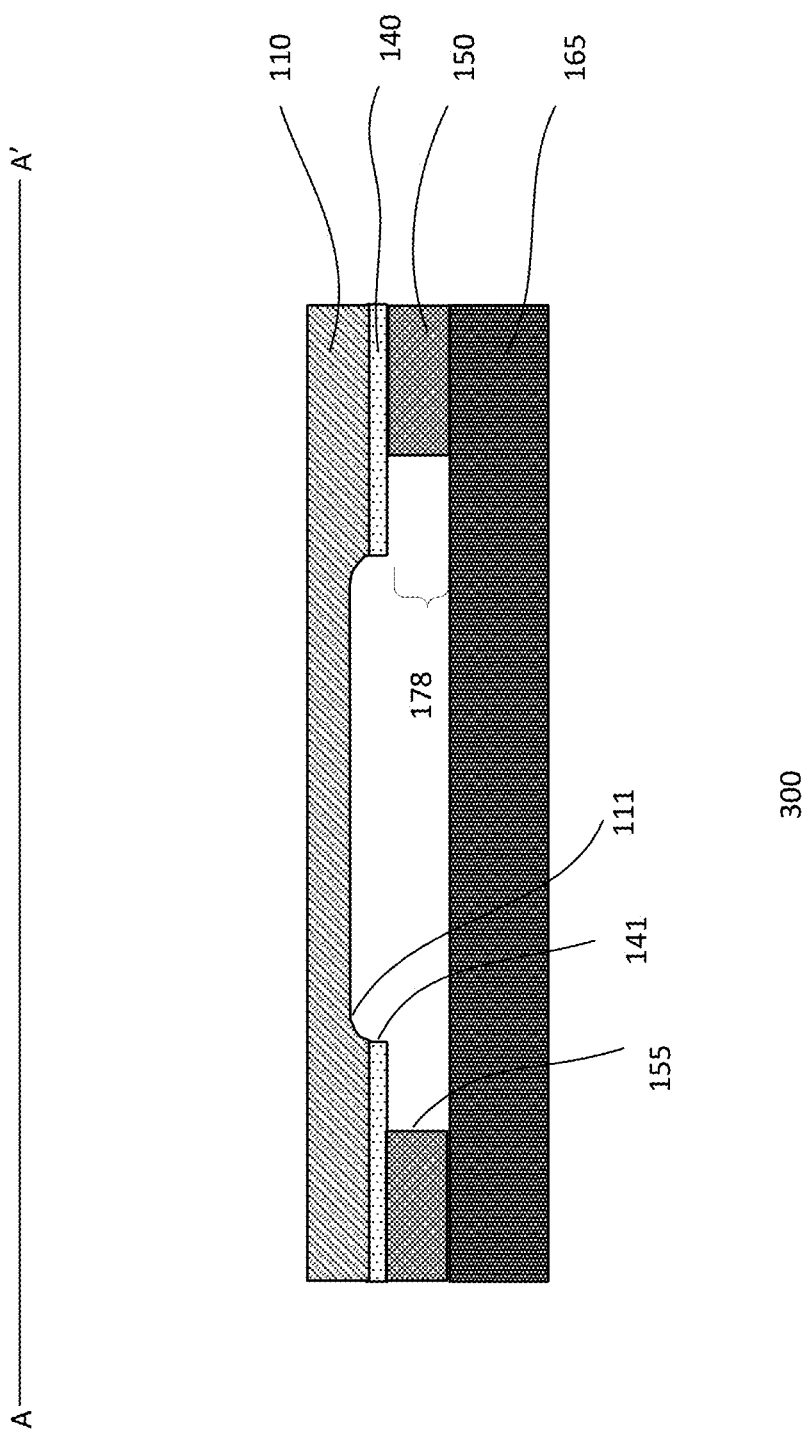

As shown in FIG. 3c, in one embodiment, a thinning process is performed on the back surface of the wafer to reduce the thickness of the wafer 110. For example, the active or front surface of the wafer is mounted onto a temporary carrier 165. The temporary carrier may be a carrier wafer. The back surface of the wafer is thinned to achieve a desired thickness of the wafer. The thinning process, for example, may be a mechanical grinding process using a grinding tool, such as a resin bonding wheel and polishing tool. The back surface of the wafer is grounded to ensure a uniform thickness as well as relieving stress. Other technologies may also be useful.

Figure 3D:
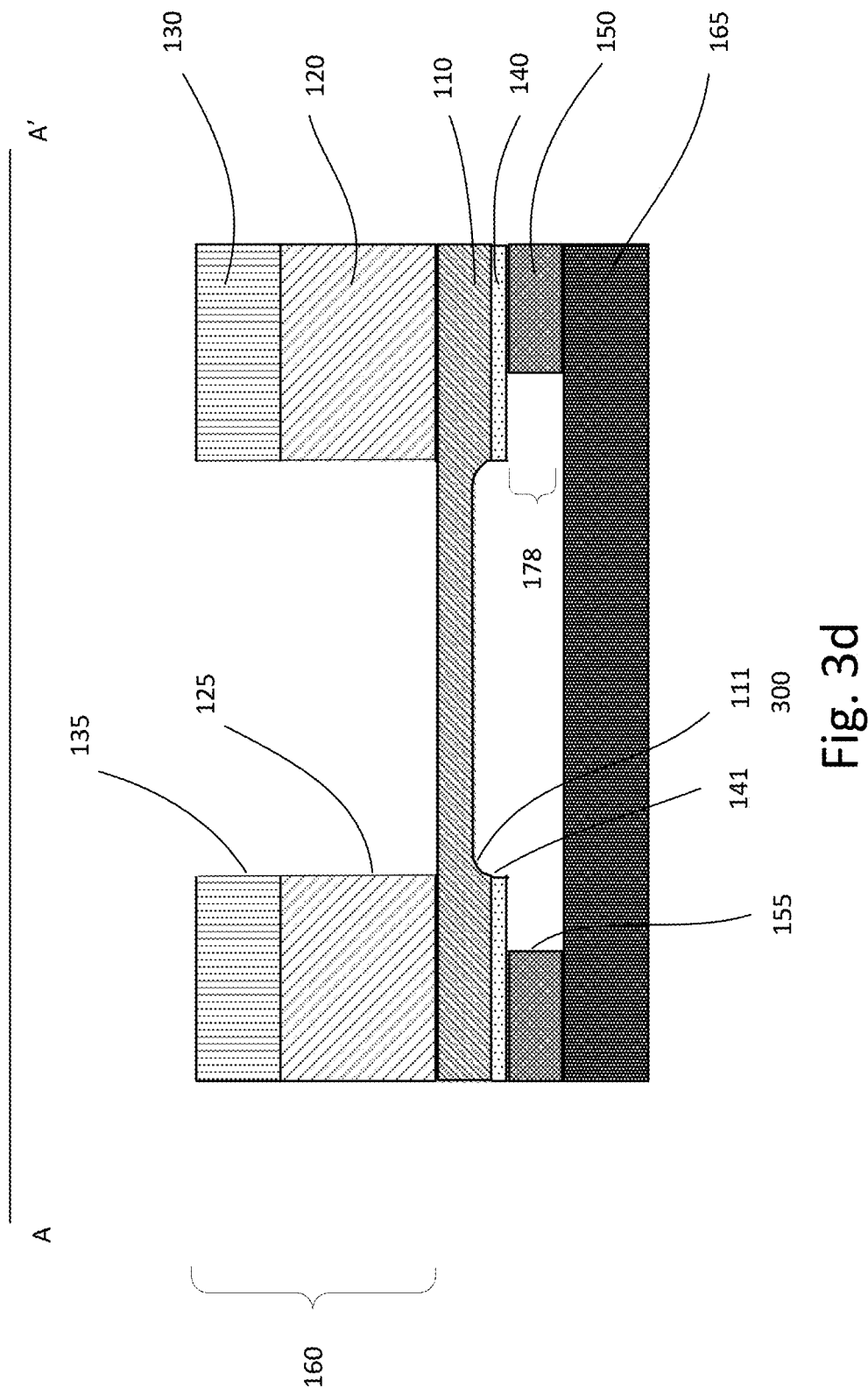

Referring to FIG. 3d, BSM 160 is formed on the bottom or inactive surface of the dies. The BSM may include a metal stack having at least one metal layer. The BSM may include, for example, gold, silver, chromium, titanium, tungsten, vanadium, nickel, other metals and alloys thereof. The BSM may be formed by chemical vapor deposition, sputter deposition, e-beam evaporation or plating. Other techniques may also be useful.

As shown, the BSM 160 includes first and second metal layers 120 and 130. The first metal layer is disposed on the inactive wafer surface and the second metal layer 130 is disposed on the first metal layer 120. In one embodiment, the first metal layer is a silver layer while the second metal layer is a nickel layer. The thickness of the first metal layer may be about 50 µm while the second metal layer may be about 30 µm thick. Other numbers, types, thicknesses or configurations of metal layers may also be useful. The metal layers may be formed by sputtering or electroplating. Other techniques may also be used to form the BSM.

In one embodiment, the BSM 160 is formed by selectively plating the first and second metal layers 120 and 130 on a seed layer (not shown) over the inactive die surface. The seed layer, for example, may be deposited by sputtering or evaporating. Other techniques, such as physical vapor deposition (PVD) or chemical vapor deposition (CVD), may also be useful. The seed layer may be patterned for selective plating. For example, the seed layer may be patterned using mask and etch techniques. For example, an etch using a mask may be performed to remove the seed layer from the saw street region or having the saw street region covered by a plating mask, such as a resist layer. The BSM is formed on exposed portions of the seed layer. Other techniques for preparing the seed layer for selective plating may also be useful. The plating process selectively forms a patterned BSM with saw streets. In one embodiment, the plating process selectively forms a patterned BSM with saw streets using a resist plating mask. The plating mask is removed after forming the patterned BSM, exposing the saw streets.

As described, the patterned BSM is achieved without an etch process performed on the BSM. For example, the BSM includes unetched sidewalls. The sidewalls of the BSM may be vertical or substantially vertical. For example, the first metal layer sidewall 125 and second metal layer sidewall 135 may have vertical or substantially vertical sidewalls. The BSM sidewalls, such as the first metal layer sidewall 125 and the second metal layer sidewall 135, serve as the bottom portion 170 of the sidewall profile.

Figure 3E:
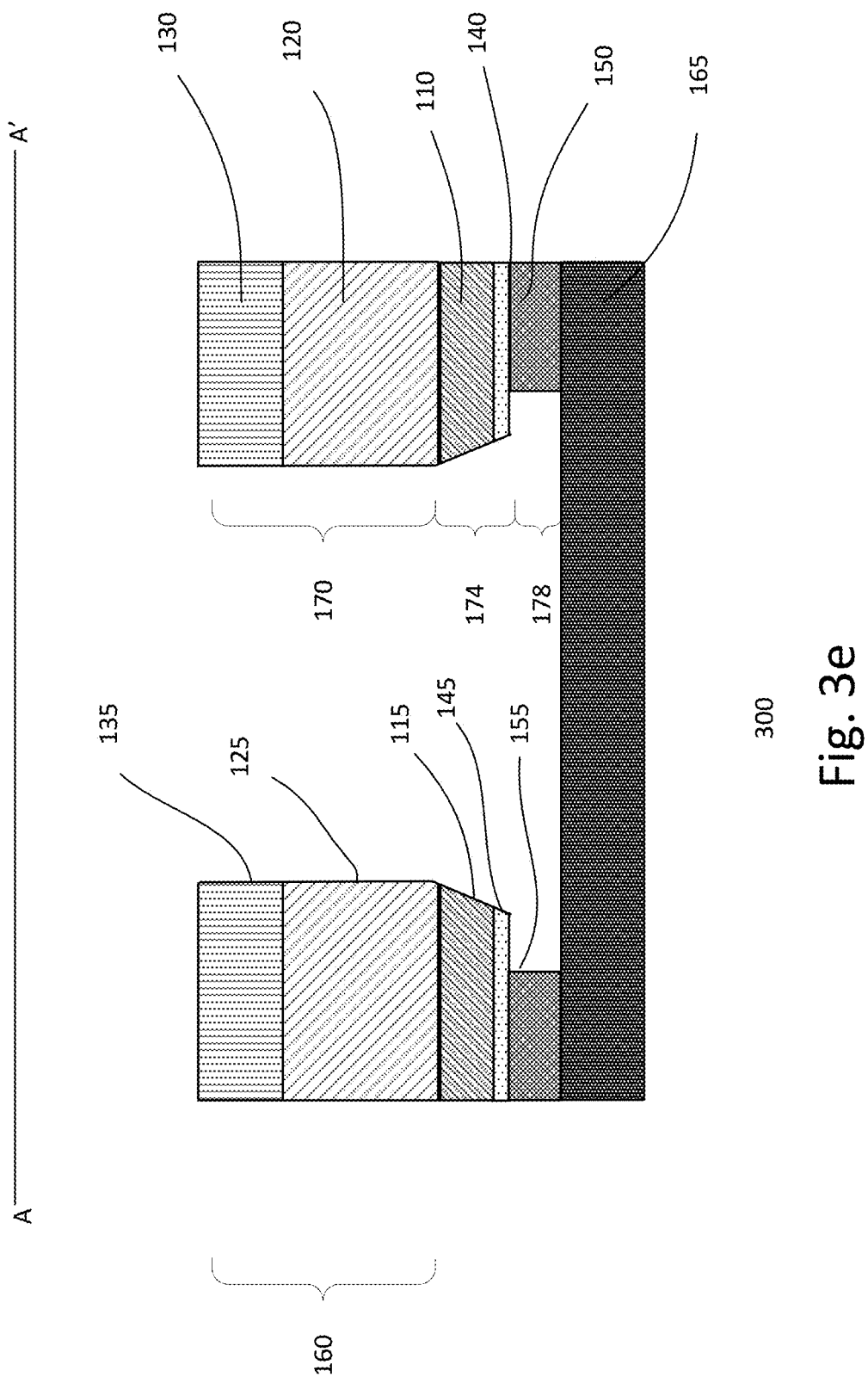
Figure 3F:
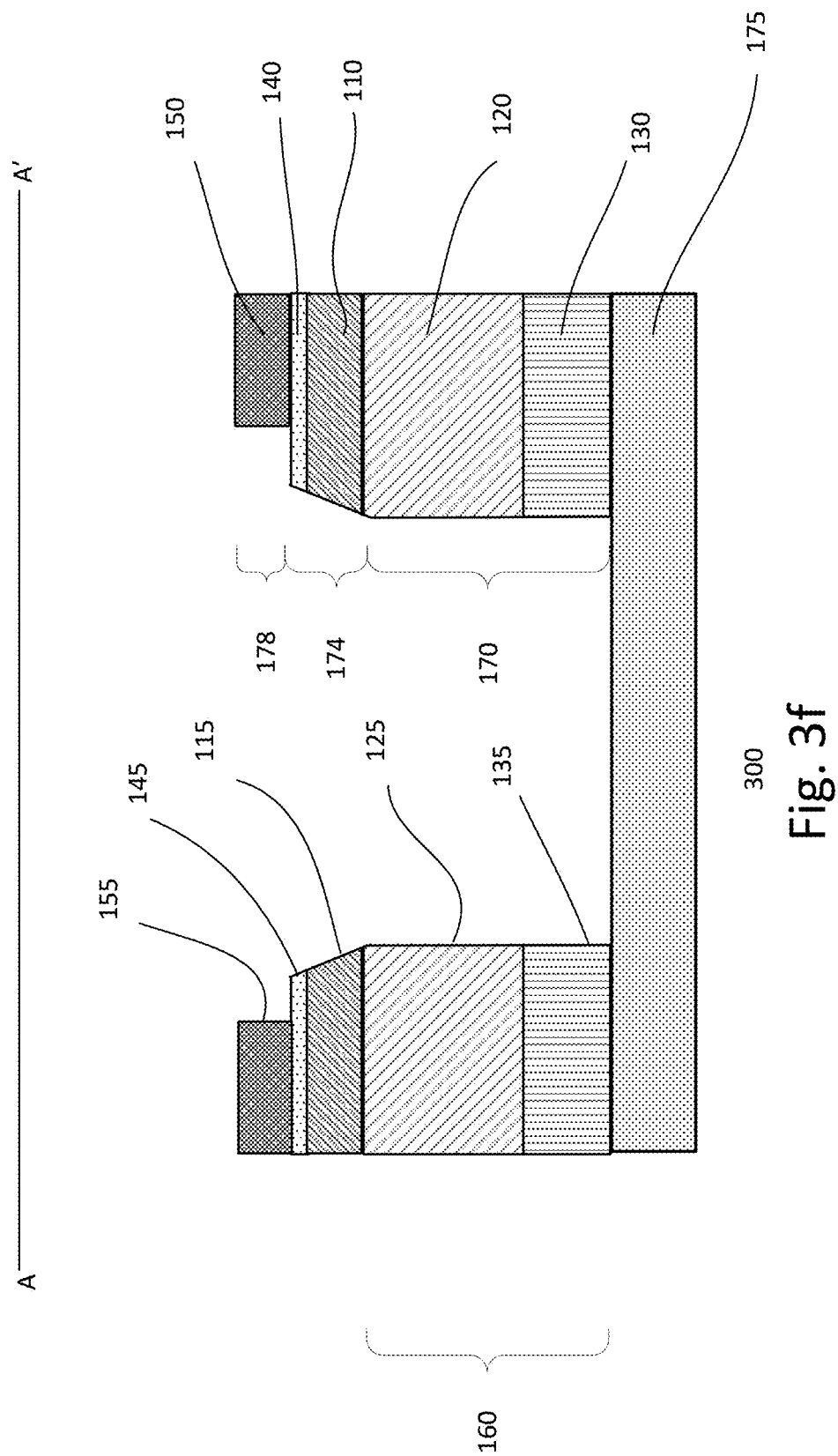

Referring to FIG. 3e, the wafer 110 is cut or diced to singulate the die packages. In one embodiment, the dicing process includes a dry etch, such as a plasma etch. The plasma etch etches the wafer selective to the BSM. For example, the BSM is etched at a much lower etch rate than on metal. In effect, the sidewalls of the BSM results in an unetched sidewall surface compared to other parts of the wafer. The dicing process is performed from the back surface of the wafer, using the patterned BSM as an etch mask. In one embodiment, the dry etch over etches, resulting in slanted sidewalls 115 and 145 for the wafer and the first passivation layer. For example, the intermediate portion includes slanted sidewalls. The slanted sidewalls of the wafer and the first passivation layer serve as the intermediate portion 174.

After the dicing process, the packages are singulated. In one embodiment, the singulated dies may be reversed mounted on another carrier or tape 175 for further processing. For example, the back surface of the wafer is mounted onto another carrier or tape and the initial carrier wafer on the active surface is removed.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
providing a wafer with a front surface and a back surface, the front surface includes a plurality of dies, wherein the wafer includes defined saw streets in first and second orthogonal directions between rows and columns of dies;
forming backside metallization (BSM) over the back surface of the wafer, wherein forming the BSM comprises selectively forming the BSM layer on the back surface of the wafer, wherein the selectively formed BSM layer is formed on the back surface of the wafer except in the saw streets, exposing the saw streets; and
etching the wafer from the back surface of the wafer using the selectively formed BSM layer as an etch mask to singulate the wafer into individual dies, wherein etching the wafer from the back surface forms wafer sidewalls with slanted wafer sidewall surfaces.

2. The method in claim 1 wherein selectively forming the BSM comprises:
depositing a seed layer on the back surface of the wafer;
patterning the seed layer to form a patterned seed layer, wherein the patterned seed layer exposes the saw streets on the back surface of the wafer; and
selectively plating the BSM on the patterned seed layer.

3. The method in claim 2 wherein patterning the seed layer comprises:
forming a resist layer on the seed layer;
patterning the resist layer to form a patterned resist layer, the pattered resist layer exposes the saw streets; and etching the seed layer using the patterned resist layer to form the patterned seed layer.

4. The method in claim 1 wherein selectively forming the BSM layer comprises:
forming a plating mask on the back surface of the substrate, wherein the plating mask covers the saw streets;
selectively forming the BSM on the back surface of the substrate exposed by the plating mask.

5. The method in claim 1 wherein selectively plating the BSM comprises forming a BSM stack having multiple metal layers.

6. The method in claim 1 comprising wherein:
forming a passivation layer on the front die surface covering the plurality of dies;
patterning passivation layer to expose saw streets on the front surface of the wafer; and
wherein etching of the wafer from the back surface of the wafer forms slanted sidewalls for the wafer, resulting in the singulated dies having vertical sidewalls for the BSM and the slanted sidewalls for the wafer and the passivation layer.

7. The method in claim 6 wherein etching of the wafer comprises plasma etching.

8. The method in claim 1 comprising:
forming a passivation stack which includes
forming a first passivation layer on the front die surface covering the plurality of dies, and
forming a second passivation layer on the first passivation layer;
patterning the passivation stack which includes
patterning the second passivation layer to form patterned second passivation layer with second passivation openings in the saw streets on the front wafer surface, wherein a width of the second passivation openings is wider than a width of the saw streets,
patterning the first passivation layer exposed by the second passivation openings to form a patterned first passivation layer with first passivation openings, wherein a width of the first passivation openings is the same as the saw streets, resulting in sidewalls of the patterned second passivation layer recessed from sidewalls of the patterned first passivation layer; and
wherein etching of the wafer from the back surface forms slanted sidewalls for the wafer, resulting in the singulated dies having vertical sidewalls for the BSM, the slanted sidewalls for the wafer and the first passivation layer and vertical sidewalls for the second passivation layer.

9. The method in claim 1 comprising thinning the back surface of the wafer to achieve a desired thickness of the wafer prior to forming the BSM.

10. The method in claim 8 wherein etching of the wafer comprises plasma etching.

11. A semiconductor package comprising:
a die with a front die surface, a back die surface and die sidewalls, the die back surface comprises a backside surface of a wafer, wherein a plurality of dies are formed on a frontside surface of the wafer, wherein the die sidewalls comprise slanted die sidewalls starting from the backside surface of the wafer;
a backside metallization (BSM) disposed on the back die surface, wherein the BSM comprises vertical BSM sidewalls.

12. The semiconductor package in claim 11 wherein the slanted die sidewalls comprise plasma etched slanted die sidewall surfaces.

13. The semiconductor package in claim 11 wherein the die comprises a passivation layer, the passivation layer forms the front die surface, the die sidewalls including the passivation layer comprises the slanted die sidewalls.

14. The semiconductor package in claim 13 wherein the slanted die sidewalls comprises plasma etched slanted die sidewalls.

15. The semiconductor package in claim 11 wherein:
The die comprises a passivation stack, the passivation stack forms the top die surface, the passivation stack comprises
a first passivation layer below a second passivation layer, the second passivation layer is recessed from edges of the first passivation layer;
the package comprises an upper side package profile, an intermediate side package profile and an upper side package profile, and wherein
the upper side package profile is defined by vertical sidewalls of the second passivation layer,
the intermediate side package profile is defined by sidewalls of the first passivation layer and the die below the first passivation layer, the intermediate side package profile comprises slanted die sidewalls, and
the lower side package profile is defined by the BSM vertical sidewalls.

16. The semiconductor package in claim 15 wherein the slanted die sidewalls comprise plasma etched slanted die sidewalls.

17. The semiconductor package in claim 16 wherein:
a top surface of the passivation stack defines a top package surface; and
a bottom surface of the BSM defines a bottom package surface.

18. The semiconductor package in claim 16 wherein the vertical BSM sidewalls comprise unetched vertical BSM sidewalls.

19. A semiconductor package comprising:
a die with a front die surface, a back die surface, and side die surfaces, wherein an upper portion of the die includes a second passivation layer over a first passivation layer, a top surface of the second passivation layer serves as the front die surface and a top package surface;
backside metallization (BSM) on the back die surface, wherein a bottom BSM surface which opposes a top BSM surface on the back die surface serves as the bottom package surface; and
a package side profile of the semiconductor package comprises
an upper side package profile portion defined by vertical sidewalls of the second passivation layer,
an intermediate side package profile portion defined by sidewalls of the first passivation layer and die portion of the die below the first passivation layer, wherein the intermediate side package profile portion is slanted and includes plasma etched intermediate side package profile surfaces, the upper side package profile portion is recessed from the intermediate side package profile portion, and
a lower side package profile portion defined by vertical sidewalls of the BSM, wherein the lower side package profile portion is aligned with the back die surface.

20. The semiconductor package in claim 19 wherein:
the vertical sidewalls of the BSM comprise unetched vertical sidewalls; and sidewalls of the intermediate side package profile portion comprise plasma etched sidewalls.

\* \* \* \* \*